United States Patent
Cappelli

(10) Patent No.: US 8,312,693 B2
(45) Date of Patent: Nov. 20, 2012

(54) PHOTOVOLTAIC ROOF LAYING METHOD

(75) Inventor: Fulvio Cappelli, San Vendemiano (IT)

(73) Assignee: Tegola Canadese SpA, Beneto (TV) (IT)

( * ) Notice: Subject to any disclaimer, the term of this patent is extended or adjusted under 35 U.S.C. 154(b) by 20 days.

(21) Appl. No.: 12/864,924

(22) PCT Filed: Jan. 23, 2009

(86) PCT No.: PCT/IB2009/000130
§ 371 (c)(1), (2), (4) Date: Nov. 4, 2010

(87) PCT Pub. No.: WO2009/095762
PCT Pub. Date: Aug. 6, 2009

(65) Prior Publication Data
US 2011/0047929 A1    Mar. 3, 2011

(30) Foreign Application Priority Data

Jan. 28, 2008 (IT) .............................. TV2008A0018

(51) Int. Cl.
*E04B 1/00* (2006.01)
*E04G 21/00* (2006.01)
*E04G 23/00* (2006.01)

(52) U.S. Cl. ...................................... 52/748.1; 52/173.3
(58) Field of Classification Search ................. 52/173.3, 52/518, 748.1
See application file for complete search history.

(56) References Cited

U.S. PATENT DOCUMENTS

| | | | |
|---|---|---|---|
| 4,574,160 A * | 3/1986 | Cull et al. ..................... | 136/245 |
| 4,860,509 A * | 8/1989 | Laaly et al. .................. | 52/173.3 |
| 5,470,396 A * | 11/1995 | Mongon et al. ............... | 136/251 |
| 5,590,495 A * | 1/1997 | Bressler et al. .............. | 52/173.3 |
| 5,611,120 A | 3/1997 | Riceman | |
| 2002/0129849 A1* | 9/2002 | Heckeroth ..................... | 136/251 |
| 2003/0154666 A1* | 8/2003 | Dinwoodie ................... | 52/173.3 |
| 2003/0154667 A1* | 8/2003 | Dinwoodie ................... | 52/173.3 |
| 2004/0144043 A1* | 7/2004 | Stevenson et al. ........... | 52/173.3 |
| 2005/0178428 A1* | 8/2005 | Laaly et al. ................... | 136/251 |
| 2005/0178430 A1* | 8/2005 | McCaskill et al. ............ | 136/251 |
| 2006/0032527 A1* | 2/2006 | Stevens et al. ................ | 136/251 |
| 2009/0000221 A1* | 1/2009 | Jacobs et al. ................. | 52/173.3 |

(Continued)

FOREIGN PATENT DOCUMENTS
DE    1127509 B    4/1962
(Continued)

*Primary Examiner* — Brian Glessner
*Assistant Examiner* — Brian D Mattei
(74) *Attorney, Agent, or Firm* — Egbert Law Offices, PLLC

(57) ABSTRACT

Photovoltaic bituminous tile for a photovoltaic roof, production method of the tile and laying method of the roof, in which: the photovoltaic bituminous tile includes the photovoltaic module that integrates at least one amorphous silicon triple junction solar cell and electric connector, coupled to a bituminous base by a sticking phase; and in which the installation of the photovoltaic roof requires two phases. In the first phase in which the photovoltaic bituminous tiles are placed, each is provided with an electric connector, placed side-by-side to the other at the lateral edge and surmounted near the upper longitudinal edge, and, at least at the connection of each tile placed side-by-side to the other, with at least one angular 'L' shaped section to which a covering is joinable. The second phase involves performing the electrical connections with protection of the connections and of the connector by application of the protection covering.

2 Claims, 8 Drawing Sheets

U.S. PATENT DOCUMENTS

2009/0178350 A1* 7/2009 Kalkanoglu et al. ......... 52/173.3

FOREIGN PATENT DOCUMENTS

| | | | |
|---|---|---|---|
| FR | 2840751 A | 12/2003 |
| NL | 1005184 C1 | 8/1998 |
| WO | 99/49584 A | 9/1999 |
| WO | 00/49919 A | 8/2000 |
| WO | 2004/083658 A | 9/2004 |

* cited by examiner

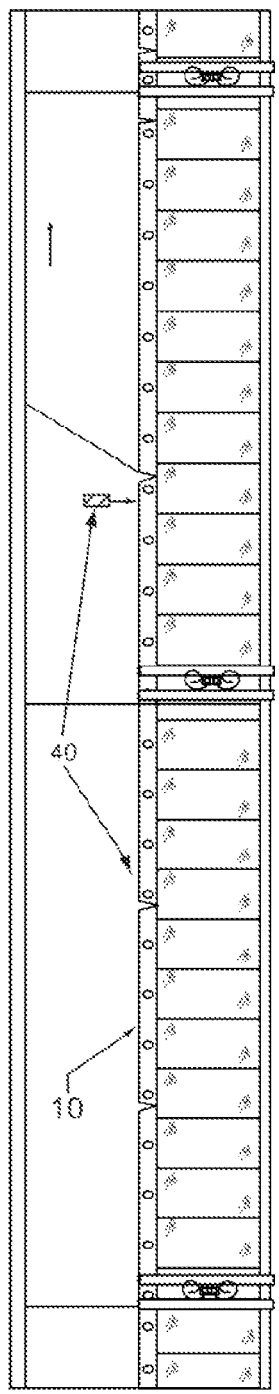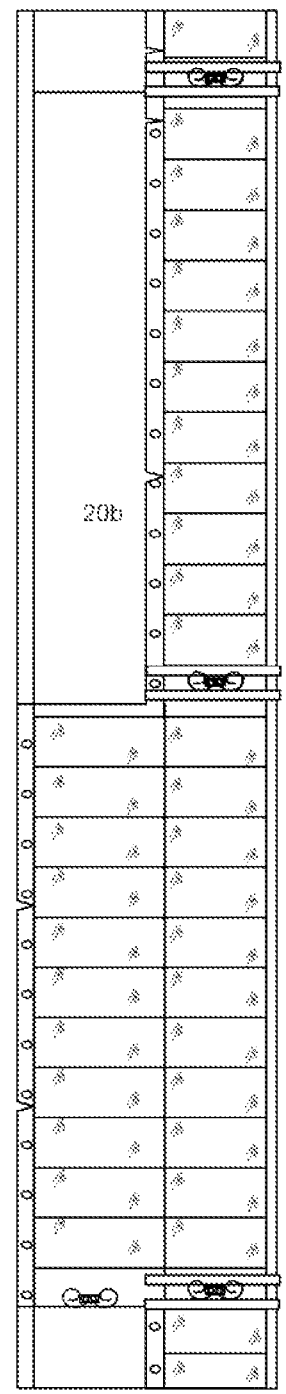
FIG. 14
FIG. 15

PHOTOVOLTAIC ROOF LAYING METHOD

CROSS-REFERENCE TO RELATED U.S. APPLICATIONS

Not applicable.

STATEMENT REGARDING FEDERALLY SPONSORED RESEARCH OR DEVELOPMENT

Not applicable.

NAMES OF PARTIES TO A JOINT RESEARCH AGREEMENT

Not applicable.

REFERENCE TO AN APPENDIX SUBMITTED ON COMPACT DISC

Not applicable.

BACKGROUND OF THE INVENTION

1. Field of the Invention

The subject of this invention is a photovoltaic bituminous tile for a photovoltaic roof, the production method of the photovoltaic bituminous tile and the photovoltaic roof laying method.

2. Description of Related Art Including Information Disclosed Under 37 CFR 1.97 and 37 CFR 1.98

Bituminous tiles are known. We refer substantially to stratified products suitable in particular to roof covering, that is in all cases where there is a flat support structure, whose external surface, e.g. the roof, needs a water-proofing and insulating coating. For example, Tegola Canadese® www.t-egolacanadese.com is one of the main makers of these products, placing itself among the best international companies producing and commercializing bituminous tiles. In principle, the production process of a conventional bituminous tile requires one glass film layer unrolled by an accumulator to be sent through a coating station. The coating station has the purpose of associating a bitumen layer both on the upper and lower side of the glass film layer. With the aim of increasing resistance to fire and bad weather, stabilizing minerals are then joined and later some grit) for example made up with shattered stone, pigmented and treated if needed with a ceramic process), which is applied only on the upper surface of the coating and then pressed. The function of the grit is to confer color to the bituminous tile flat surface and at the same time to protect the coating from ultraviolet rays. Finally, a silicon-based removing layer is applied on the lower surface to prevent the batch from attaching to the plant and the tiles from sticking to one of the others during packing.

The multi-layer product, made as such, is then cut into tiles. Finally one can observe that some variations to the conventional bituminous tiles can provide the application to the substrate obtained in such a way with an additional coating layer, that in such cases can be a valuable metal, e.g. copper.

In principle, the use of photovoltaic cells for the production of electrical power is known. On the www.uni-solar.com website for instance, a particular solar cell is described, stratified, obtained with vacuumed rolling process, using amorphous silicon. Such means, in the household field, are usually placed on the roof of the residence or other types of building, and have the purpose of transforming the captured solar energy into continuous electric current which is sent to an inverter and later transformed in alternate for conventional use. Introduced for many years in a multitude of technologies, both as source of energy often subordinate to that traditionally generated and as primary source even if intended exclusively for some particular uses, photovoltaic cells are part of a more complex system in continuous evolution. Every cell, along with others of the same kind, thus creates a photovoltaic system, that is composed of an ensemble of mechanical, electronic and electric components, that participate in capturing and transforming the available solar energy, and converting it in electric energy for the user. This system has been known for more than one hundred years in the field of scientific applications, but has only in recent years been more common also in other sectors. Among these, a niche market includes equipment for buildings in general, such as residences in which solar panels have always been appreciated to a greater extent by the public due to the multiple advantages that, usually, they are able to offer.

The general concept relative to the combination of the photovoltaic cell with a generic product for roof coating, e.g. the tile obtained from inert materials or synthetic tiles is known.

For instance, in patent literature U.S. Pat. No. 5,990,414 (Posnansky) where a photovoltaic roof is described. Over an already existing cover structure, obtained in fibro cement tiles, for each tile, one corresponding photovoltaic cell is joined, then connected in series with one of the other cells, as many as there are tiles, allowing for the realization of a sun-capturing surface. In this case, the solar cells are simply laid on and anchored to an existing tile, by means of adhesive or pins.

In WO00/75455 (Kaneka), a tile is described which, on the one side and on the whole surface, is provided with a recess inside of which there are connector means. The solar cell, in this way can be introduced and vice-versa inside the mentioned recess, allowing the coupling with said connector means.

CH682831 (Von Burg, et al.) again concerns a flat tile, in clay or other natural material, shaped so as to provide the two interlocking superimposable and opposite side edges in such a way as to allow for the continuity of the cover along the plane of the pitch. At least one solar cell is mounted along the upper side, so as to be controlled in the position individually.

Also in the field of synthetic tiles or with synthetic substrate, there are solutions similar to the previous, where the general concept of joining some photovoltaic cells to a tile is substantially known. For example, W02007079584 (Metten et al.) describes a modular system that contains a composite tile, with or without integrating photovoltaic cells, a track system for joining the tiles to the structure, and a wiring system for photovoltaic tiles. An extrusion or moulding process can be used to produce the tiles and the track, including the integration of cells. The tracks are included in the structure. The track and the tile have connecting characteristics so that the track can be interlocked with the tile. Adjacent tiles are applied by means of overlapping. The photovoltaic cells can be moulded inside or associated to the tile. A connecting bar or connecting cables are joined to the track. When the photovoltaic tile is blocked with the track, photovoltaic cell connectors engage the connecting bar or the cables to provide for an electric connection.

US2007193618 (Bressler et al.) describes an integrated solar cover system for converting the solar energy into electrical energy. The system includes a first row of photovoltaic cover tiles, with a number of interconnected photovoltaic cells. The pre-existing products can form part of tiles, e.g. synthetic tiles including the bituminous tiles. The tiles have generally a rectangular form and can have one or more holes for securing them to the structure of the roof. Each tile has a first wing that extends from the base of the tile with at least one hole and provides a first electric conducting material on the first side. The cover tiles include a second localised wing on the second side of the base of the tile and a second hole that goes through said wing and the base of the tile. The second wing furthermore has a second conducting material on the second side of the base of the tile. The first wing is at least partially superimposed on the second wing of the adjacent tile, aligning the holes so as to obtain an electric connection in series.

JP2007051478 (Wakebe) describes a roof with a functional panel able to reduce costs improving waterproofing. The tile that integrates the solar cell is placed next to the adjacent tile by means of interposing a side connecting section. A cover profile is superimposed to the side connecting profile.

All this considered, the following characteristics can be reasonably known:
  solar cells and in particular amorphous silicon solar cells;
  bituminous tiles;
  solutions of conventional tiles that integrate solar cells;
  solutions of bituminous tiles combined with solar cells;
  roof covers providing photovoltaic cells that transform solar energy in electrical energy used partly for domestic use and partly for heating up water for household use;
  roof covers, with bituminous tiles that integrate solar cells, joined by means of overlapping; and
  a production system of photovoltaic tiles obtained with extrusion or moulding process used to produce tiles, including the integration of cells.

In principle the solutions until today adopted seem suitable for use. However, some drawbacks can be ascribed to them, e.g. insufficient capturing capacity of the individual photovoltaic tiles reflecting on the total efficiency of the integrated system in the roof. The existing photovoltaic tiles, moreover, for the most part cannot be walked upon and have a considerable weight above all in relation to the fact that they require heavy metallic carpentry works, e.g. in the realization of the support frame. Other drawbacks can be attributed to the present production method that appears complicated and not easily reproducible on industrial scales at reasonable costs. The same is in relation to the laying of the photovoltaic tiles, as the adopted systems are complex, with overly long laying times and furthermore the roof once laid does not allow for functional and fast maintenance. All this considered, the necessity for enterprises of the sector to find innovative solutions which are able to optimize the solutions to-date used is reasonable.

BRIEF SUMMARY OF THE INVENTION

These and other aims are reached by the present invention according to the characteristics as in the included claims, solving the arising problems by means of a photovoltaic bituminous tile for photovoltaic roof, production method of the photovoltaic bituminous tile and laying method of the photovoltaic roof. Of which: a) the photovoltaic bituminous tile is composed of the photovoltaic module that integrates at least one triple junction solar cell in amorphous silicon and electric connecting means, coupled to a bituminous base consisting of a bituminous layer of mm 5±2 mm, a glass film double support of 85 g/m2±8.5 g/m2 impregnated with pure oxidized bitumen and a bituminous self-gluing paste; b) the photovoltaic module is coupled at the bituminous base by means of a sticking phase; c) and further in which, the installation of the photovoltaic roof with the photovoltaic bituminous tiles, requires two phases; a first phase in which the photovoltaic bituminous tiles are aligned in parallel rows, each tile provided with electrical connection means, each tile side by side with another tile with the side edge and surmounted at the upper longitudinal edge, and with, at least at the connection of each tile next to the other at least one angular "L" section of the type pre-holed, precoupled with butylic band whose section is unitable to a covering; the second phase requiring the execution of electrical connections with protection of connections and of the connecting means by means of application of the protection covering.

In this way, through the considerable creative contribution the effect of which constitutes immediate and non-negligible technical progress, multiple important aims and advantages are achieved.

A first aim was to obtain a photovoltaic bituminous tile with optimized and high capturing surface, with a high energetic yield also in unfavourable orientation conditions and tilts, like for flat facades and roofs. The photovoltaic bituminous tile object of this invention is robust, weatherproof, able to produce energy with a constant power also at high operating temperatures. It is also flexible and therefore particularly suitable also for uneven surfaces, has reduced thickness, a good insulating capacity and contained weight. The photovoltaic bituminous tile, finally, can be walked upon, is attractive, integrating perfectly from the architectonic point of view in the cover mantle.

A second aim was to allow for the easy reproducibility of the photovoltaic bituminous tile, in contained times and in quantities, inexpensively.

A third aim includes favoring fast installation of the photovoltaic roof, riveted or torch applied, that does not need load bearing substructures, using conventional workforce.

In respect of the previous solutions, the fact that all the wirings are executed with hermetically sealed connectors, are accessible on the upper side of the roof and are easily attainable throughout the installation's lifespan, always capable of being inspected simply unscrewing and removing the coverings.

A particular waterproofing between the photovoltaic tiles and those contiguous is furthermore guaranteed by the butylic applied under the "L" angle sections.

In conclusion, these advantages have the non-negligible value of obtaining a photovoltaic bituminous tile and a production method of the photovoltaic bituminous tile with a good technological content.

These and other advantages will appear from the following detailed description of a preferred embodiment with the aid of enclosed schematic drawings whose execution details are not to be considered limiting but only and exclusively illustrative.

BRIEF DESCRIPTION OF THE DRAWINGS

FIGS. 13 and 14 are schematic views that represent further installation phases of the photovoltaic roof, and in particular relative to the positioning of spacers and to the removal of the film along the adhesive upper band;

FIG. 15 is a schematic view that represents the contiguous laying to a first row, of a second row of photovoltaic bituminous tiles;

Finally.

DETAILED DESCRIPTION OF THE INVENTION

Figure 3:
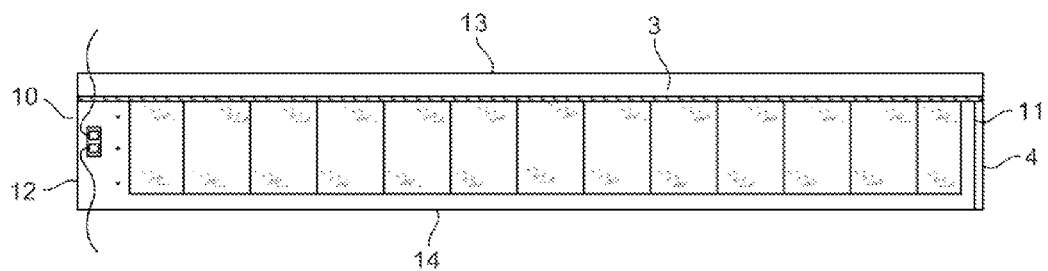
FIG. 3 is a plan view of the photovoltaic bituminous tile.
Figure 19:
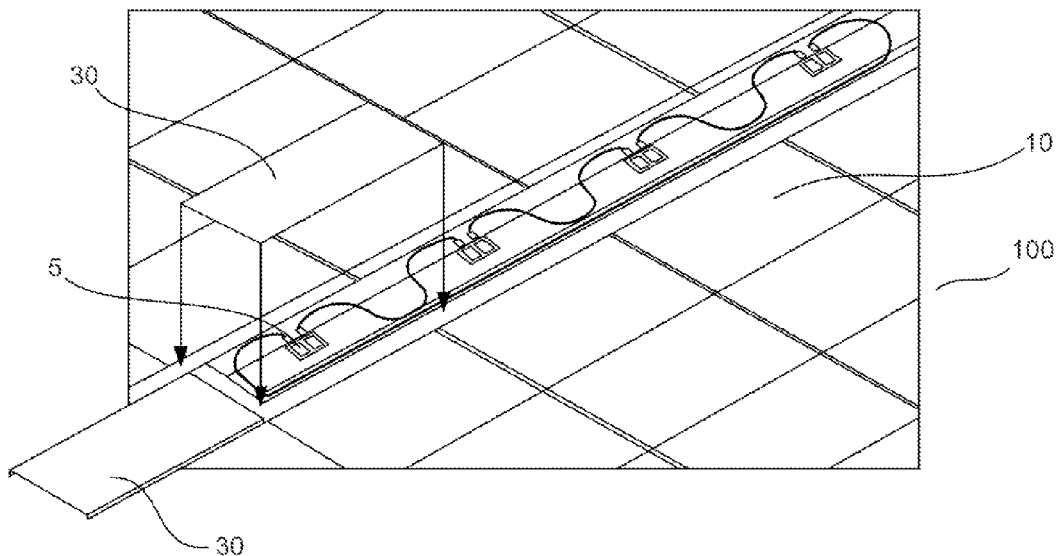
FIGS. 19 and 20 are plan views of the completion phases of the laying of the photovoltaic roof that represent the electric connection and the close-down of wirings by means of the protective covering.

The present innovation refers to a photovoltaic bituminous tile 10 (FIG. 3) suitable for constituting, along with other similar photovoltaic bituminous tiles 10a, 10b, 10c, (FIGS. 19-20) the coating with proofing and insulating function of a photovoltaic roof 100 or the integration of a photovoltaic roof 100 on a roof with bituminous tiles cover mantle.

Each photovoltaic bituminous tile 10, 10a, 10b, 10c, appears with a shape that seen from above is essentially rectangular, with two side edges 11, 12 respectively right-hand and left-hand and two longitudinal edges, respectively upper 13 and lower 14. Near the upper longitudinal edge 13 for its whole length, there is an adhesive band 3 protected by a removable film.

Figure 2:
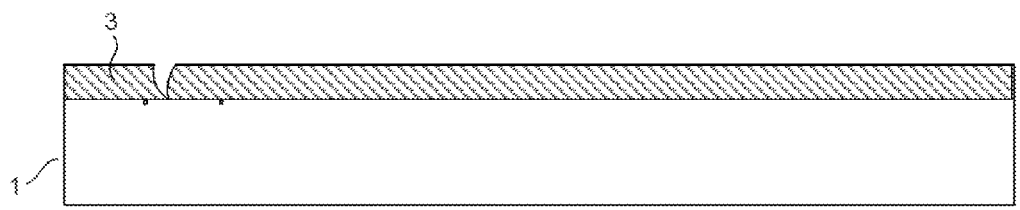
FIG. 2 is a plan view of the bituminous base.

The photovoltaic bituminous tile 10, 10a, 10b, 10c, is of the type including a bituminous base 1 (FIG. 2), the thickness of the bituminous layer of which is of about, mm 5±2 mm, made up of a glass film double support of 85 g/m²±8.5 g/m², impregnated with pure oxidized bitumen and a bituminous self-gluing paste. The bituminous base 1 is of the type produced according to the European standard EN 544, co-d. 4×83, with weight of 8.5 kg having the sizes of about cm 288×44.5. The resistance to the longitudinal traction is of about 1500 N. The transverse traction is of about 1500 N, and positive wind according to the standard ASTM-D 31 61.

Figure 1:
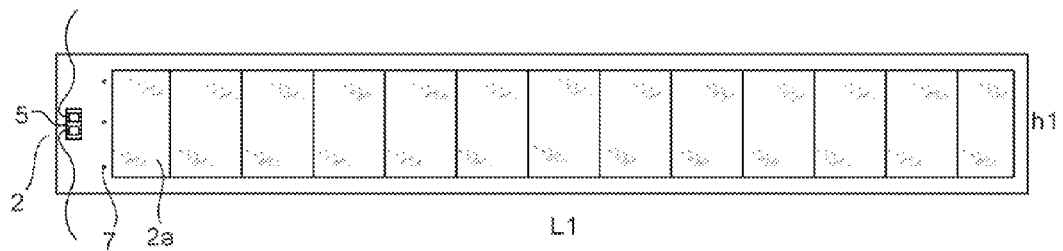
FIG. 1 is a plan view of the photovoltaic module.

At the bituminous base 1 is coupled overlapping the photovoltaic module 2 (FIG. 1) at the facade. The photovoltaic module 2 of the rolled type integrates at least one triple junction amorphous silicon solar cell, in this case, it includes eleven adjacent and coplanar solar cells, connected between them, supported by a common metallic flexible layer, each triple junction solar cell with a transparent upper contact, e.g. the module model PVL 68/T described and produced by the American de jure corporation United Solar Ovonic. The bituminous base 1 and the photovoltaic module 2 that integrates on one side electrical connecting means 5 in particular a connector, having a shape that from above is rectangular, where the height h1 of the photovoltaic module 2 is less than that of the bituminous base 1, so that once coupled to form the photovoltaic bituminous tile 10, 10a, 10b, 10c, an adhesive longitudinal band 3 remains with removable protective film, not involved by the overlapping of the photovoltaic module 2. Also, the length L1 of the photovoltaic module 2 is less than that of the bituminous base 1, in such a way that in coupled condition (FIG. 3) at the edge 11 a side band 4 remains, perpendicular as to the adhesive band 3 not involved by the overlapping of the photovoltaic module 2. In this case (FIG. 3), at the side edge 12 of the photovoltaic bituminous tile 10, 10a, 10b, 10c, once the two components, photovoltaic module 2 and bituminous base 1 have been coupled, there is a substantial coinciding of overlap with the common side edge 12, so as to arrange the connecting means 5 close to said side edge 12 of the photovoltaic tile 10, 10a, 10b, 10c.

Each bituminous tile 10, 10a, 10b, 10c (FIG. 9) is obtained with a production method that includes at least the joining phase by overlapping and sticking the photovoltaic module 2 to the bituminous base 1.

Figure 4:
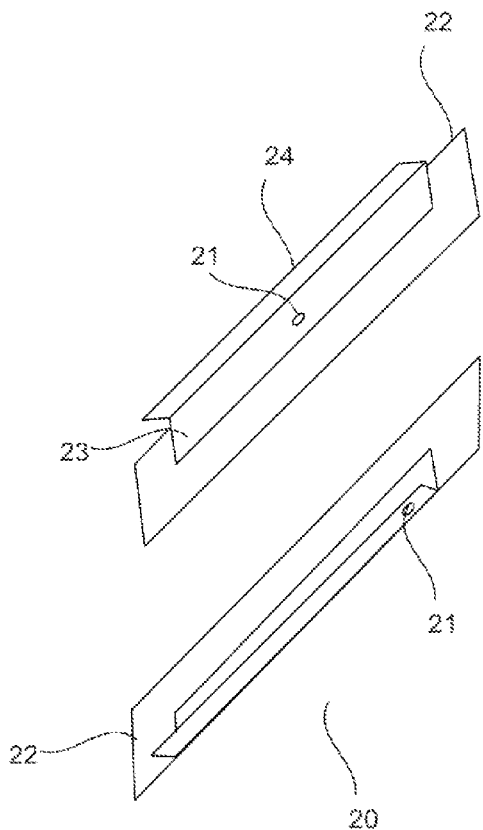
FIG. 4, is a schematic view of "L" angle sections precoupled with butylic band.
Figure 5:
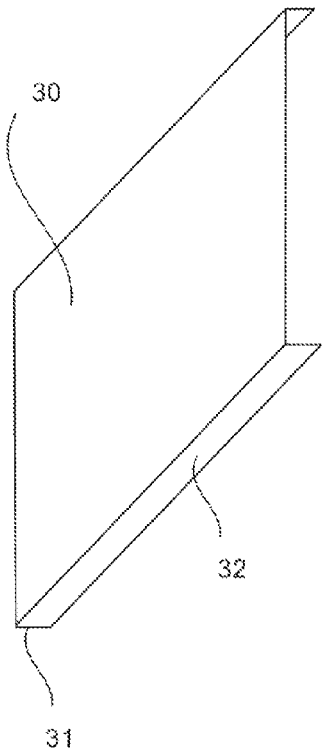
FIG. 5, is a schematic view of the covering.
Figure 6:
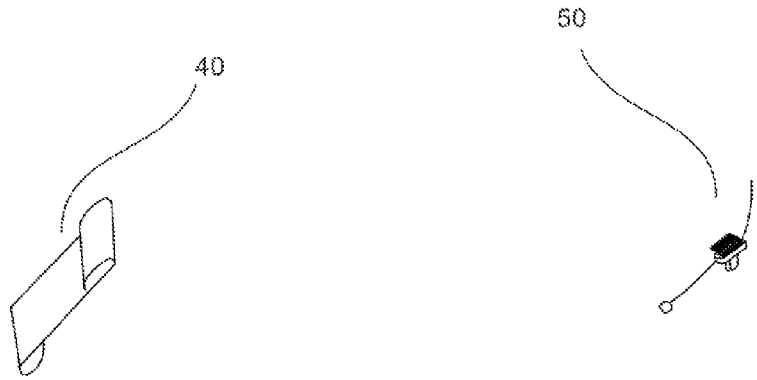
FIG. 6 is a schematic view of the "S" spacer.
Figure 7:
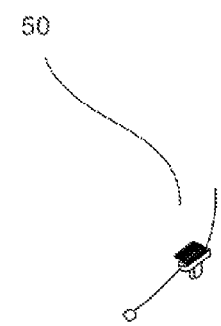
FIG. 7 is a schematic view of the adhesive foot.

Regarding the installation of the photovoltaic roof 100, besides the photovoltaic bituminous tiles 10 there is a kit of accessories that includes:
- metallic angle sections 20, with an "L" section, of the pre-holed 21 type and coupled with a butylic band 22 that in this case has a width of 5 cm (FIG. 4);
- metallic coverings 30 pre-holed 31 (FIG. 5);
- metallic spacers 40 with an "S" shape (FIG. 6); and
- PVC adhesive feet 50 with clamp (FIG. 7).

The installation method of the photovoltaic roof 100 essentially requires two phases. A first phase in which the photovoltaic bituminous tiles 10, 10a, 10b, 10c are laid on the pitch of the roof T to be covered and a second phase where the photovoltaic bituminous tiles 10, 10a, 10b, 10c are electrically connected by means of connecting means 5.

Figure 8:
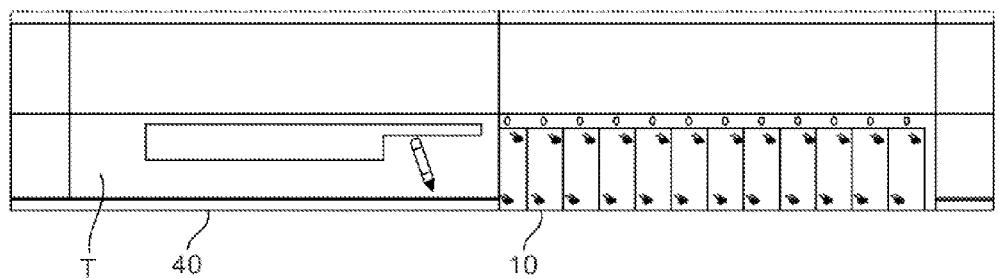
FIG. 8 is a plan view of the laying of a first photovoltaic bituminous tile.
Figure 9:
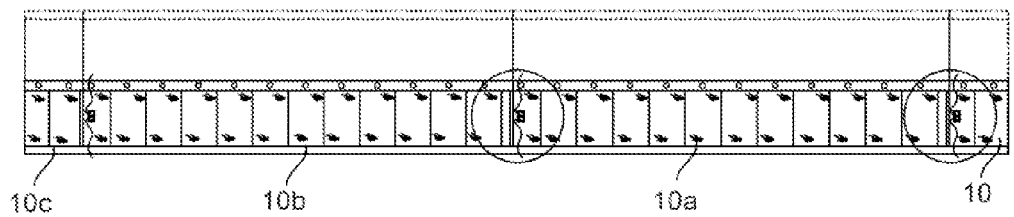
FIG. 9 is a plan view of the laying of a first row of photovoltaic bituminous tiles.
Figure 10:
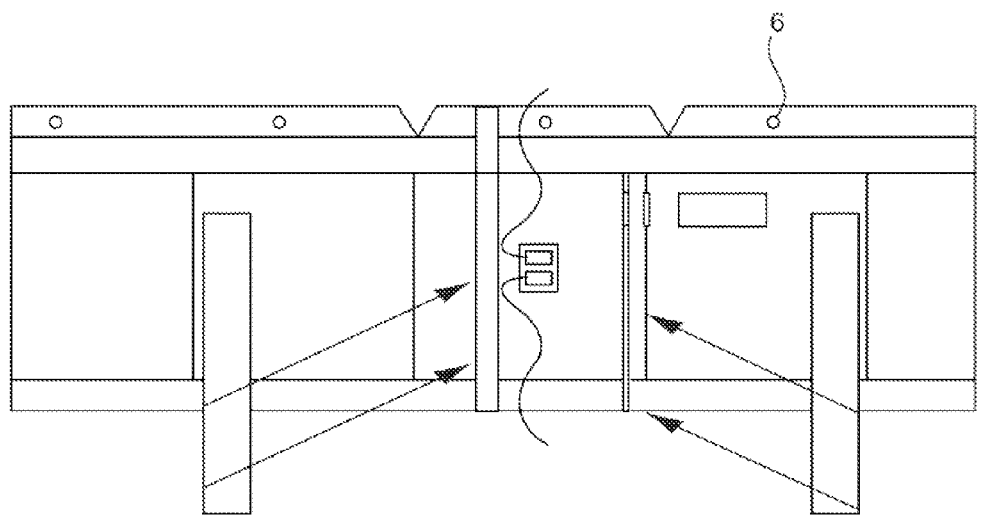
FIG. 10 is a plan view of the laying of two bituminous tiles with the side-by-side edges to which the "L" angle sections are joined.
Figure 11:
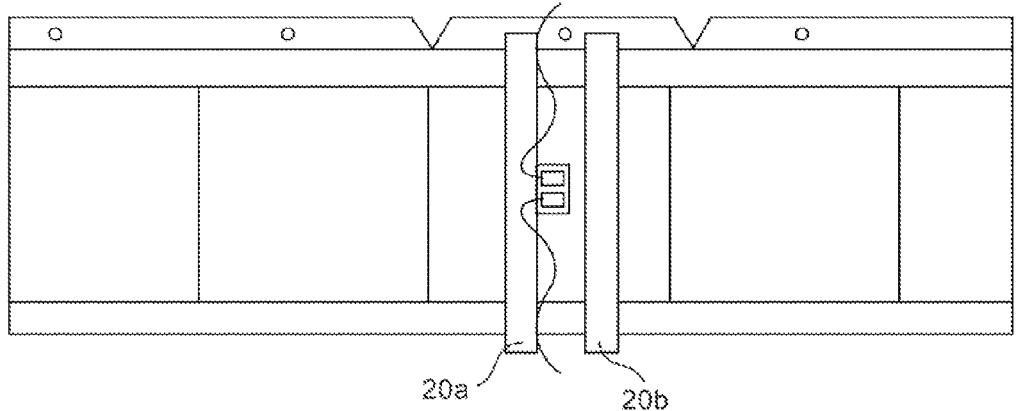
FIGS. 11 and 12 are plan views of an additional phase of the laying of two photovoltaic bituminous tiles of FIG. 10 with the side-by-side edges to which the "L" angle sections are joined.
Figure 12:
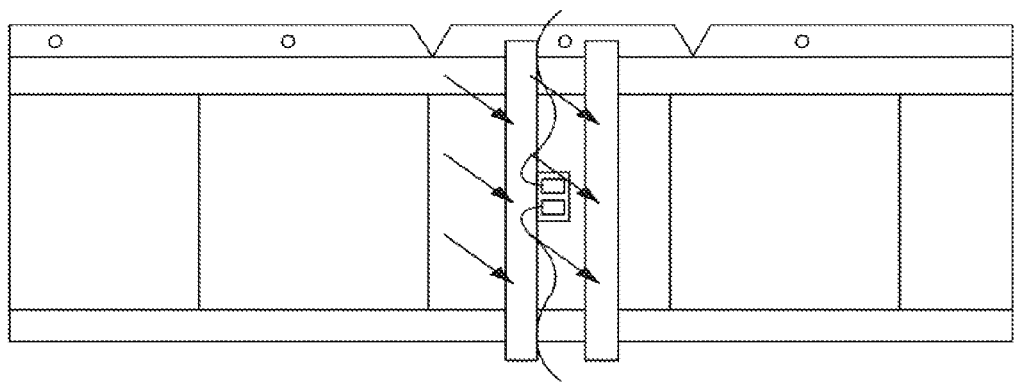
Figure 13:
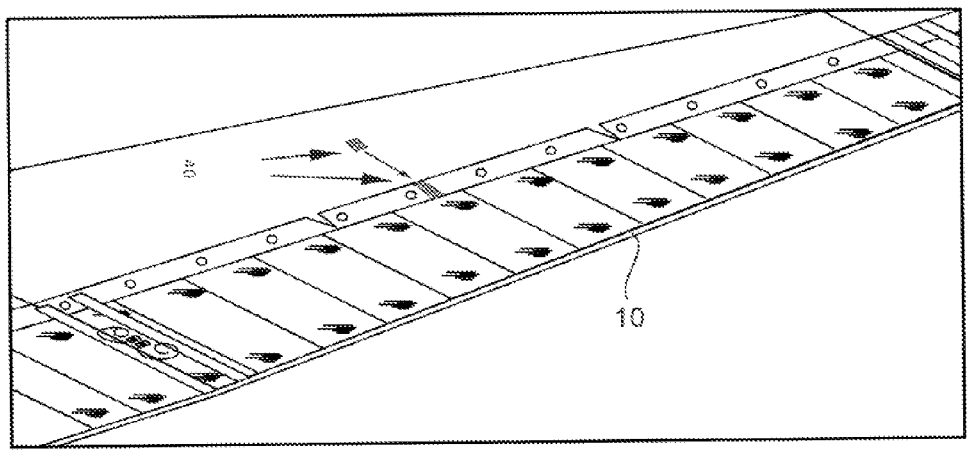

Description of the first phase, in which the installation by specialized operator in bituminous tiles is required, according to the following steps:

a) along the pitch of the roof T to be covered, the "S" spacers 40 are placed (FIG. 8), taking care to press the top edge and positioned as to the marking. The marking here is to be neglected since it depends on the arrangement of tiles on the roof, and that in this case can be considered at about 96 cm;

b) proceed to positioning the first photovoltaic bituminous tile 10 (FIG. 8) inside the marking. The photovoltaic bituminous tile 10, in this case, is riveted through the holes 6, in this case there are twelve, that are longitudinally made, equidistant and aligned at about 25 cm one from the other, along the adhesive band 3. Torch laying of the product is also provided in which case it is not necessary to carry out the riveting phase;

c) placing the other similar photovoltaic bituminous tiles 10a, 10b and 10c, on-the-left and on-the-right, placing their side edges 11, 12 side-by-side until the completion of the first row (FIG. 9);

d) in order to make the junction between the photovoltaic bituminous tiles 10, 10a, 10b and 10c waterproof, with reference to the highlighted lines in FIG. 10, the angle sections 20a, 20b with "L" section are placed, of the pre-coupled type with the butylic band 22. In principle, at each junction between the photovoltaic bituminous tiles 10, 10a, 10b and 10c, two angle sections 20a, 20b (FIG. 1 1) are provided, respectively a first angular section 20a that is punctually superimposed on the junction-line between the photovoltaic bituminous tiles 10, 10a, 10b and 10c, taking care that the butylic band 22 adheres completely to it, removing the lower protection and sealing the junction between the photovoltaic bituminous tiles 10, 10a, 10b and 10c. A second angular section 20b parallel and spaced from the first one 20a of a sufficient measure to include the connector means 5 between the same. In more detail, each angular section 20 being with an "L" section, has a base 23 with aligned holes 21 as the wall 24 is with holes 21. At the holes 21 of the base 23 of each angular section 20a, 20b to which correspond analogous holes 7 made close to the solar cell of the photovoltaic module 2 closest to the connecting means 5 of the photovoltaic bituminous tile 10, 10a, 10b and 10c, the riveting is carried out, ensuring the angle sections 20a, 20b (FIG. 12) to the pitch of the roof;

e) proceed to the removal of the upper protective film along the adhesive band 3 of the already installed tiles 10, 10a, 10b and 10c, (FIG. 13-14);

f) then along the adhesive band 3, "S" spacers 40 are placed, in this case with at about 96 cm with respect to right-hand and left-hand edge of each photovoltaic bituminous tile 10, 10a, 10b and 10c, of the first row; said "S" spacers 40 (FIG. 13-14), must be opportunely clamped to the top edge of photovoltaic bituminous tiles laid 10, 10a, 10b and 10c and further riveted in the special slot;

g) positioning of at least a second row contiguous to the first one, of photovoltaic bituminous tiles 10, 10a, 10b and 10c, placing on a case-by-case basis each photovoltaic bituminous tile 10, 10a, 10b and 10c, (FIG. 15), taking care that each photovoltaic bituminous tile 10, 10a, 10b and 10c is plugged along the lower edge 14 in the "S" spacers 40 which will also act as stops. Each photovoltaic bituminous tile 10, 10a, 10b and 10c rest at least on the butylic band 22 of "L" angle sections previously installed 20a, 20b;

h) repetition of phase (c) and (d) taking care that the butylic band 22, removing the lower protection, completely adheres and seals the junction between the photovoltaic bituminous tiles 10, 10a, 10b and 10c and between row and row (FIG. 17); and repeat the phase (e) until the completion of the laying of the photovoltaic roof 100.

Figure 20:
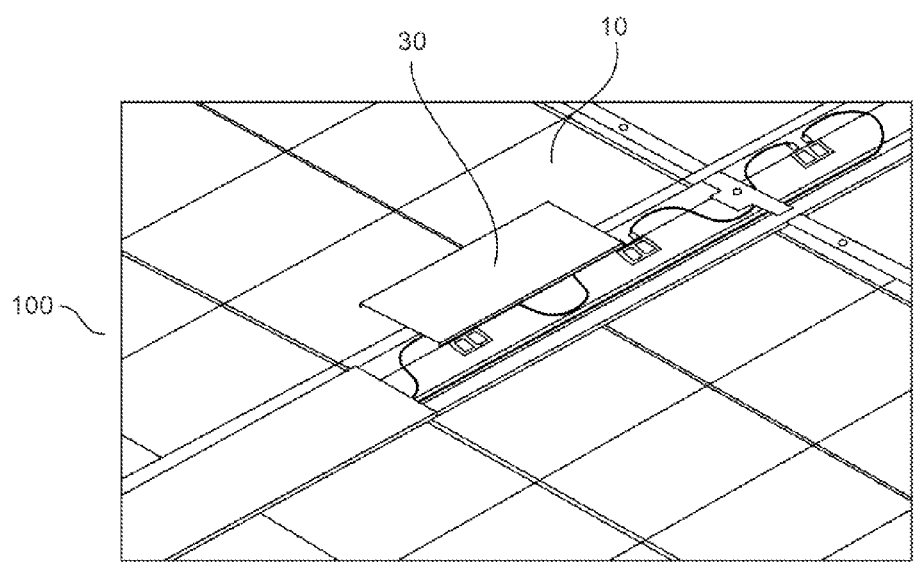

Description of the second phase that requires the intervention of an electrician;

i) executing the connections connecting the connecting means 5 between the photovoltaic bituminous tiles 10, 10a, 10b and 10c and between each row following the prescriptions of a electrical project. Italian law provides for the release of a certification on the wiring that can only be produced by a specialized electrician;

j) As protection of the connections and the connecting means 5 application of (FIG. 19) the covering 30 fixing it with the supplied screws, in the suitable holes 31 made along the walls 32, which straddles externally to the walls 24 of the "L" angles 20a, 20b (FIG. 20).

Figure 16:
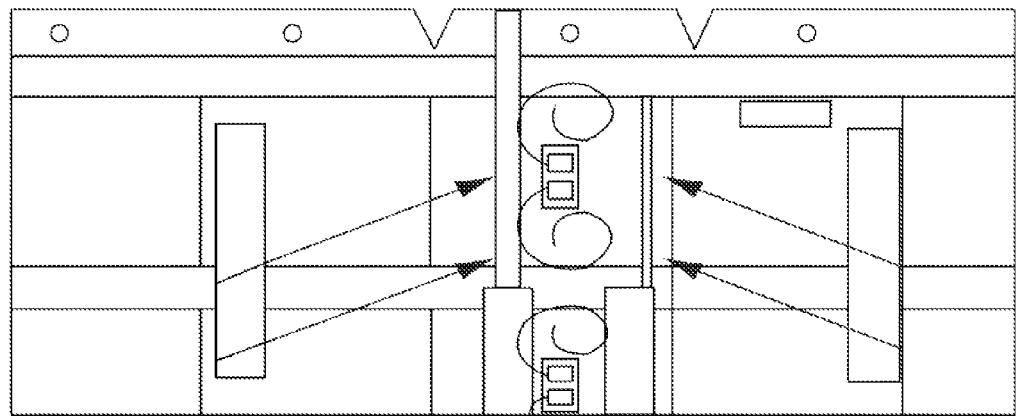
FIGS. 16, 17 and 18 are plan views of the laying phases along a second row, of two photovoltaic bituminous tiles with the side-by-side edges to which the "L" angle sections are joined.
Figure 17:
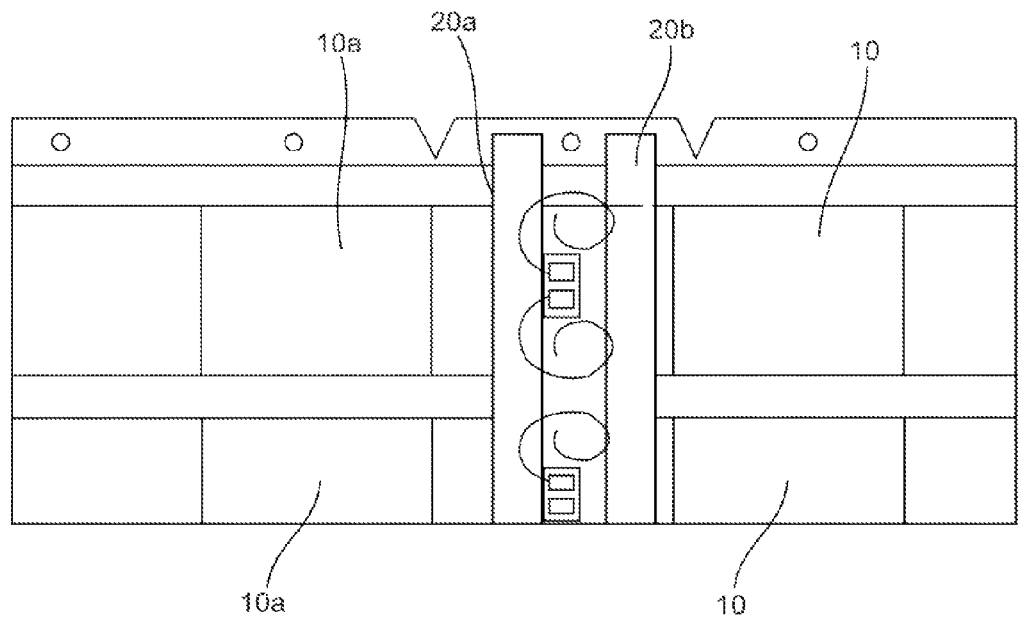
Figure 18:
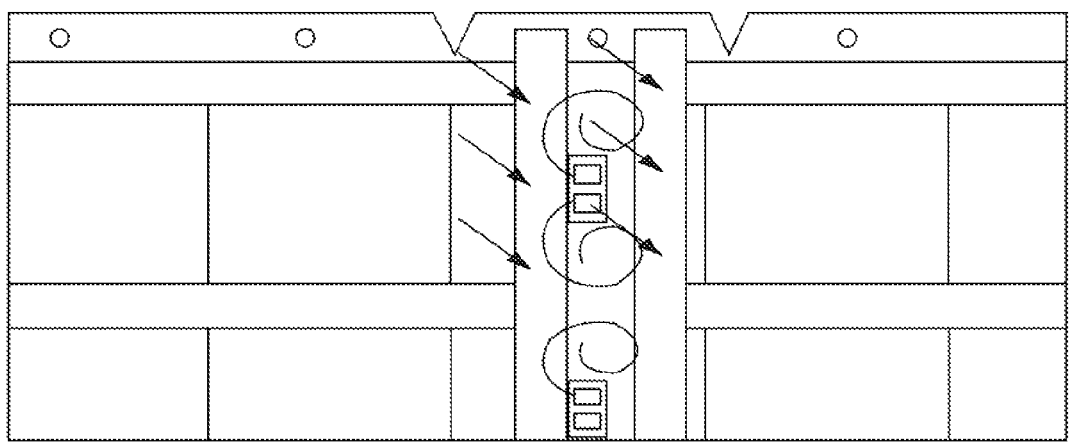

In conclusion, this laying method is based on the realization/distinction of two macro phases that first allow for the laying of the photovoltaic bituminous tile 10, 10a, 10b and 10c and then the connection with wiring. The layer of photovoltaic bituminous tiles 10, 10a, 10b and 10c is able to carry out the installation according to a communicated arrangement. Its part is completed carrying out the installation of the "L" angle sections 20a, 20b (FIGS. 4 and 16) and the waterproofing of junctions and therefore of the mantle (FIG. 17);

leaving the connectors free, he will give the way to the work of the electrician. The electrician therefore, connects the photovoltaic bituminous tiles 10, 10a, 10b and 10c in rows and the rows in parallel configuration to the inverter. He will finally protect the cables and the connecting means 5 with the installation of the metallic coverings 30 simply screwing them to the "L" angle sections 20a, 20b.

I claim:

1. A method of laying a photovoltaic roof in which the photovoltaic roof has photovoltaic bituminous tiles, the method comprising:

placing a plurality of spacers along a pitch of the roof according to a marking thereon;

positioning a first photovoltaic bituminous tile inside the marking;

fixing the first photovoltaic bituminous tile to the roof by riveting or by torching;

placing a plurality of further photovoltaic bituminous tiles in side-by-side relation on at least one side of said first photovoltaic bituminous tile so as to complete a first row, each of the plurality of photovoltaic bituminous tiles having an upper protective film over an adhesive band formed thereon;

joining said first photovoltaic bituminous tile with said plurality of further photovoltaic bituminous tiles in waterproof relation;

positioning a pair of angle sections with a butylic band at each junction between the adjacent photovoltaic bituminous tiles, one of said pair of angle sections being superimposed at a junction line between the adjacent photovoltaic bituminous tiles such that the butylic band adheres thereto, the other of said pair of angle sections being parallel to and spaced from said one of said pair of angle sections so as to have a connector therebetween;

removing the upper protective film from the adhesive band on the photovoltaic bituminous tiles;

positioning the spacers onto the adhesive bands of photovoltaic bituminous tiles along a top edge of the photovoltaic bituminous tiles;

placing another row of photovoltaic bituminous tiles contiguous to the photovoltaic bituminous tiles of the first row, the spacers receiving the lower edge of the photovoltaic bituminous tiles of said another row, the photovoltaic bituminous tiles of a second row positioned onto the butylic band of the angle section;

connecting the connectors of the photovoltaic bituminous tiles of the first row to said second row together; and applying a covering by screws into holes formed along a wall of the angle section so as to protect the connected connectors.

2. The method of claim 1, each of the angle sections having an L-shaped section with a base with aligned holes.

* * * * *